(12) United States Patent
Ankoudinov et al.

(10) Patent No.: US 8,148,748 B2
(45) Date of Patent: Apr. 3, 2012

(54) ADJUSTABLE FIELD EFFECT RECTIFIER

(75) Inventors: Alexei Ankoudinov, Redmond, WA (US); Vladimir Rodov, Seattle, WA (US)

(73) Assignee: STMicroelectronics N.V., Geneva (CH)

( * ) Notice: Subject to any disclaimer, the term of this patent is extended or adjusted under 35 U.S.C. 154(b) by 0 days.

(21) Appl. No.: 12/238,308

(22) Filed: Sep. 25, 2008

(65) Prior Publication Data

US 2009/0078962 A1 Mar. 26, 2009

Related U.S. Application Data

(60) Provisional application No. 60/975,467, filed on Sep. 26, 2007, provisional application No. 61/022,968, filed on Jan. 23, 2008, provisional application No. 61/048,336, filed on Apr. 28, 2008.

(51) Int. Cl.
*H01L 29/66* (2006.01)
*H01L 29/74* (2006.01)

(52) U.S. Cl. ........ 257/124; 257/119; 257/126; 257/127; 257/130; 257/133; 257/138

(58) Field of Classification Search .......... 257/130, 257/107, E29.169, 124–127, 133, 155, 159, 257/118, 135, 142, 119, 138
See application file for complete search history.

(56) References Cited

U.S. PATENT DOCUMENTS

| | | |
|---|---|---|
| 3,602,777 A | 8/1971 | Berman |
| 3,603,811 A | 9/1971 | Day et al. |
| 4,281,448 A | 8/1981 | Barry et al. |
| 4,373,252 A | 2/1983 | Caldwell |
| 4,599,576 A | 7/1986 | Yoshida et al. |
| 4,610,730 A | 9/1986 | Harrington et al. |
| 4,630,084 A * | 12/1986 | Tihanyi .............. 257/342 |
| 4,722,856 A | 2/1988 | Albrecht et al. |
| 4,783,348 A | 11/1988 | Albrecht et al. |
| 4,903,189 A | 2/1990 | Ngo et al. |
| 4,962,411 A | 10/1990 | Tokura et al. |
| 4,967,243 A | 10/1990 | Baliga et al. |
| 4,969,028 A | 11/1990 | Baliga |
| 4,982,260 A | 1/1991 | Chang et al. |
| 4,996,581 A | 2/1991 | Hamasaki |
| 5,019,530 A | 5/1991 | Kleinsasser et al. |
| 5,021,861 A | 6/1991 | Baliga |

(Continued)

FOREIGN PATENT DOCUMENTS

EP 0322400 A2 6/1989

(Continued)

OTHER PUBLICATIONS

Ankudinov, A. et al, "High injection regime of the super barrier(TM) rectifier," Solid-State Electronics, vol. 51, No. 5, pp. 714-718. Mar. 2007.

(Continued)

*Primary Examiner* — Zandra Smith
*Assistant Examiner* — Jeremy Joy
(74) *Attorney, Agent, or Firm* — Wolf, Greenfield & Sacks, P.C.

(57) ABSTRACT

An Adjustable Field Effect Rectifier uses aspects of MOSFET structure together with an adjustment pocket or region to result in a device that functions reliably and efficiently at high voltages without significant negative resistance, while also permitting fast recovery and operation at high frequency without large electromagnetic interference.

45 Claims, 11 Drawing Sheets

U.S. PATENT DOCUMENTS

| | | | | |
|---|---|---|---|---|
| 5,070,377 | A | * | 12/1991 | Harada ........................ 257/336 |
| 5,111,253 | A | | 5/1992 | Korman et al. |
| 5,304,831 | A | * | 4/1994 | Yilmaz et al. .................. 257/341 |
| 5,381,025 | A | * | 1/1995 | Zommer ........................ 257/138 |
| 5,387,805 | A | | 2/1995 | Metzler et al. |
| 5,396,085 | A | | 3/1995 | Baliga |
| 5,416,354 | A | | 5/1995 | Blackstone |
| 5,430,315 | A | | 7/1995 | Rumennik |
| 5,446,295 | A | | 8/1995 | Whitney |
| 5,532,502 | A | | 7/1996 | Seki |
| 5,545,573 | A | | 8/1996 | Narazaki et al. |
| 5,554,880 | A | | 9/1996 | Metzler et al. |
| 5,559,355 | A | * | 9/1996 | Yamazaki et al. ............. 257/341 |
| 5,621,234 | A | * | 4/1997 | Kato ............................ 257/339 |
| 5,629,536 | A | | 5/1997 | Heminger et al. |
| 5,643,809 | A | | 7/1997 | Lien |
| 5,719,411 | A | | 2/1998 | Ajit |
| 5,744,994 | A | * | 4/1998 | Williams ...................... 327/374 |
| 5,747,841 | A | | 5/1998 | Ludikhuize |
| 5,751,025 | A | | 5/1998 | Heminger et al. |
| 5,818,084 | A | * | 10/1998 | Williams et al. .............. 257/329 |
| 5,825,079 | A | | 10/1998 | Metzler et al. |
| 5,869,380 | A | | 2/1999 | Chang |
| 5,877,515 | A | | 3/1999 | Ajit |
| 5,886,383 | A | | 3/1999 | Kinzer |
| 5,898,982 | A | | 5/1999 | Metzler et al. |
| 5,929,690 | A | | 7/1999 | Williams |
| 5,932,922 | A | | 8/1999 | Metzler et al. |
| 5,956,582 | A | | 9/1999 | Ayela et al. |
| 6,034,385 | A | | 3/2000 | Stephani et al. |
| 6,051,850 | A | * | 4/2000 | Park .............................. 257/133 |
| 6,097,046 | A | | 8/2000 | Plumton |
| 6,100,145 | A | | 8/2000 | Kepler et al. |
| 6,169,300 | B1 | * | 1/2001 | Fragapane .................... 257/146 |
| 6,172,398 | B1 | * | 1/2001 | Hshieh ......................... 257/330 |
| 6,186,408 | B1 | | 2/2001 | Rodov et al. |
| 6,225,280 | B1 | | 5/2001 | Dokter et al. |
| 6,235,601 | B1 | | 5/2001 | Kim |
| 6,258,634 | B1 | | 7/2001 | Wang et al. |
| 6,313,001 | B1 | | 11/2001 | Johansson et al. |
| 6,323,091 | B1 | | 11/2001 | Lee et al. |
| 6,331,455 | B1 | | 12/2001 | Rodov et al. |
| 6,362,036 | B1 | | 3/2002 | Chiozzi et al. |
| 6,373,097 | B1 | | 4/2002 | Werner |
| 6,384,456 | B1 | | 5/2002 | Tihanyi |
| 6,399,996 | B1 | | 6/2002 | Chang et al. |
| 6,404,033 | B1 | | 6/2002 | Chang et al. |
| 6,420,225 | B1 | | 7/2002 | Chang et al. |
| 6,426,541 | B2 | | 7/2002 | Chang et al. |
| 6,448,160 | B1 | | 9/2002 | Chang et al. |
| 6,476,442 | B1 | * | 11/2002 | Williams et al. .............. 257/328 |
| 6,498,367 | B1 | * | 12/2002 | Chang et al. .................. 257/341 |
| 6,515,330 | B1 | | 2/2003 | Hurtz et al. |
| 6,537,860 | B2 | | 3/2003 | Akiyama et al. |
| 6,624,030 | B2 | | 9/2003 | Chang et al. |
| 6,724,039 | B1 | | 4/2004 | Blanchard |
| 6,743,703 | B2 | | 6/2004 | Rodov et al. |
| 6,765,264 | B1 | | 7/2004 | Chang et al. |
| 6,784,489 | B1 | * | 8/2004 | Menegoli ...................... 257/343 |
| 6,828,605 | B2 | | 12/2004 | Eisele et al. |
| 6,853,036 | B1 | | 2/2005 | Rodov et al. |
| 6,956,266 | B1 | | 10/2005 | Voldman et al. |
| 6,967,374 | B1 | | 11/2005 | Saito et al. |
| 6,979,861 | B2 | | 12/2005 | Rodov et al. |
| 6,992,353 | B1 | * | 1/2006 | Wu ............................... 257/335 |
| 7,009,253 | B2 | | 3/2006 | Rodov et al. |
| 7,095,113 | B2 | | 8/2006 | Xiaochun et al. |
| 7,250,668 | B2 | | 7/2007 | Chang et al. |
| 7,264,999 | B2 | | 9/2007 | Xiaochun et al. |
| 7,342,389 | B1 | | 3/2008 | Wu et al. |
| RE40,222 | E | | 4/2008 | Fragapane |
| 2002/0019115 | A1 | | 2/2002 | Rodov et al. |
| 2003/0207538 | A1 | | 11/2003 | Hshieh et al. |
| 2005/0116313 | A1 | | 6/2005 | Lee et al. |
| 2005/0189626 | A1 | | 9/2005 | Xiaochun et al. |
| 2005/0189658 | A1 | | 9/2005 | Xiaochun et al. |
| 2005/0200384 | A1 | | 9/2005 | Nadd et al. |
| 2006/0097323 | A1 | | 5/2006 | Rodov et al. |
| 2007/0235752 | A1 | | 10/2007 | Rodov et al. |
| 2007/0246794 | A1 | | 10/2007 | Chang et al. |
| 2009/0026492 | A1 | | 1/2009 | Chatty et al. |

FOREIGN PATENT DOCUMENTS

| | | |
|---|---|---|
| JP | 05082534 A | 4/1993 |
| JP | 05175206 A | 7/1993 |
| JP | 06061250 A | 3/1994 |
| JP | 06112149 A | 4/1994 |

OTHER PUBLICATIONS

Ankudinov, A. et al. "Electrostatic force microscopy study of the electric field distribution in semiconductor laser diodes under applied biases," 9th Int. Symp. "Nanostructures: Physics and Technology," St. Petersburg, Russia, Jun. 18-22, 2001, pp. 198-201.

Ankudinov, A. et al., "Fine Structure of the Inner Electric Field in Semiconductor Laser Diodes Studied by EFM," Phys. Low-Dim. Struct., 3/4, 2001, pp. 9-16.

Ankudinov, A. et al., "Study of high power GaAs-based laser diodes operation and failure by cross-sectional electrostatic force microscopy," 10th Int. Symp. Nanostructures: Physics and Technology, Jun. 17-21, 2002, St. Petersburg, Russia, pp. 143-145.

Bashirov, A.M. et al., "Switching of thyristors using the dU/dt effect," Radiotekhnika i Elektronika, vol. 14, No. 2, USSR, Feb. 1969, pp. 374-375.

Bixby, B. et al., "Application Considerations for Very High Speed Fast Recovery Power Diodes," IEEE, IAS 1977 Annual, pp. 1023-1027.

Chelnokov, E. et al, "Effect of moving charge carriers in a collector junction of p-n-p-n structure on the switching on process," Radiotekhnika I Elektronika, v 16, USSR, 1971, pp. 1039-1046.

Christiansen, B. "Synchronous Rectification," PCIM, Aug. 1998, pp. 14-21.

Hikin, B. et al., "Reverse Recovery Process with Non-Uniform Lifetime Distribution in the Base of a Diode," IEEE, IAS 1977 Annual, pp. 644-647.

Huth, G., "Study of the Spatial Characteristics of the Breakdown Process in Silicon PN-Junctions," Proc. of the 2nd Int. Conf. on Transmutation Doping in Semiconductors, University of Missouri, Columbia, MO, Apr. 23-26, 1978, pp. 91-108.

Kuz'min, V.A. et al., "P-N-P-N-Structures Turning on at High-Voltage and High-Current Density, " Radiotekhnika I Elektronika, vol. 20, No. 7, USSR, 1975, pp. 1457-1465.

Kuz'min, V.A. et al., "The turn-on process of p-n-p-n structures at high voltages and a high current density, " Radiotekhnika i Elektronika, vol. 20, No. 8, USSR, Aug. 1975, pp. 1710-1714.

Kuz'min, V.A. et al., "Turn-on of a p-n-p-n structure at a high current density," Radiotekhnika i Elektronika, vol. 18, No. 1, USSR, Jan. 1973, pp. 158-166.

Lorenz, L. et al., "Improved MOSFET, An Important Milestone Toward a New Power MOSFET Generation," PCIM, Sep. 1993, pp. 14-21.

Melnik, Y. et al., "HVPE GaN and AlGaN "Substrates" for Homoepitaxy," Materials Science Forum vols. 164-268, 1998, pp. 1121-1124.

Molibog, N.P. et al., "The effect of mobile charge carriers in the collector junction of a p-n-p-n structure on the turn-on process," Radiotekhnika i Elektronika, vol. 16, No. 6, USSR, Jun. 1971, pp. 1039-1046.

Pavlik, V.Y. et al., "The I-V characteristic of a p-n-p-n structure in the 'on' state for high residual voltages," Radiotekhnika i Elektronika, vol. 18, No. 7, USSR, Jul. 1974, pp. 1468-1475.

Rodov, V. et al, "Super barrier rectifier—a new generation of power diode," IEEE Transactions on Industry Applications, vol. 44, No. 1, pp. 234-237, Aug. 16, 2007.

Rodov, V.I. et al., "Calculation of the Current-Voltage characteristic of an unsaturated p-n-p-n structure," Radiotekhnika i Elektronika, vol. 19, No. 6, USSR, Jun. 1974, pp. 1325-1326.

Rodov, V.I., "Non-one-dimensional processes in p-n-p-n structures," Poluprovodnikovye Pribory i ikh Primenenie, No. 28, USSR, 1974, pp. 3-22.

Vemulapati, U. et al., "The Concept of a Regenerative Diode", IEEE, 2007, pp. 193-196.
Office Action dated Mar. 3, 2011 from U.S. Appl. No. 12/359,094.

* cited by examiner

Figure 1 [PRIOR ART]

ADJUSTABLE FIELD EFFECT RECTIFIER

RELATED APPLICATIONS

This application claims the benefit under 35 U.S.C. § 119 (e) to provisional U.S. Patent Application Ser. No. 60/975,467, filed Sep. 26, 2007, having the same title as the present application, provisional U.S. Patent Application Ser. No. 61/022,968, filed Jan. 23, 2008, entitled "Regenerative Building Block and Diode Bridge Rectifier," and provisional U.S. Patent Application Ser. No. 61/048,336, filed Apr. 28, 2008, entitled "MOSFET with Integrated Field Effect Rectifier," all of which have the same inventors as the present application and are incorporated herein by reference in full for all purposes.

FIELD OF THE INVENTION

The present invention relates generally to rectifiers, and more particularly relates to rectifiers using a Field Effect structure.

BACKGROUND OF THE INVENTION

A rectifier is a two terminal device that is commonly used in electric circuits to conduct current in one direction and block current in the opposite direction. The main element of a rectifier is a potential barrier that controls current carrier flow depending on the sign of the potential applied to the external electrodes. Until recently only two major technologies were used to make rectifiers. In Schottky Barrier Diodes (SBD's), the potential barrier is created at the interface between a metal and a semiconductor. Such a barrier is defined by the difference between the work functions of the metal and the semiconductor that make the contact. SBD's provide very good low forward voltage drop (up to 0.4V), which is the major performance characteristic of a diode, but are known to have reliability problems. Due to the lack of carrier modulation they cannot withstand high forward current surges. Additional reliability problem arise due to the spiking during metallization process, which reduces the breakdown voltage and reduces overall yield. Even with the trench Schottky technology, which allows obtain higher breakdown voltage, practical SBD's are limited to breakdown voltages below 250V. The PN-junction technology is typically used for higher voltages. They provide usually higher $V_F$ (above 0.7V) and thus lower efficiency, but higher reliability. However, due to carrier density modulation they can withstand large current surges. Also since the maximum electric field is at the PN junction and not at the surface as in a SBD, the metallization spikes do not cause the early breakdown problem.

Other approaches, based on the field effect under an MOS gate, have been proposed in order to combine the high efficiency of a SBD with the high reliability of PN junction diodes. For example, in Pseudo-Schottky Barrier diodes and super barrier rectifiers, the potential barrier is created in the bulk of the semiconductor under the gate via processing (e.g. implantation, diffusion, oxidation etc.). The channel under the MOS gate is only weakly inverted and can be viewed as a barrier for majority carriers. The height of this barrier can be controlled by the gate thickness and the doping concentration under the gate. The presence of the barrier results in rectifying behavior similar to the SBD. SBD's can have a fixed barrier height, corresponding to the metals that make good contact with silicon, while in other prior art devices, the barrier height can be continuously changed. Short channel length and good control of the doping in the channel region are essential to making practical devices. The low voltage (breakdown below 100V) super barrier rectifiers have been shown to combine high reliability (similar to PN-junction diodes) and high efficiency.

However, many high voltage versions of such prior art devices (rated above 150V) exhibit negative differential resistance. Any negative resistance region can be useful to make oscillators, but in rectifiers this is undesirable behavior and needs to be avoided. Thus these prior art devices suffer from significant limitations at high voltages.

To overcome the inability of the prior art to operate reliably at high voltages, it is important to control the negative resistance region, which can involve either an increase or a decrease, depending upon other factors. The source of the negative resistance is the rapid reduction of the drift region resistivity due to the injected carriers. As shown in FIG. 1, which depicts a model of a typical prior art field effect barrier rectifier, the total drift region resistance is typically modeled as being divided into two parts, $R_1$ and $R_2$. The top resistance, $R_1$, typically controls the voltage on the P-N junction, and bottom $R_2$. Once the sum of voltage drops on the resistor $R_1$ and the channel is above the knee voltage V* of the P-N junction, the holes can be injected from P-N junction to the drift region. To maintain quasineutrality the electrons are injected from the substrate. This rapidly growing carrier concentration reduces the resistivity of the drift region and the voltage drop on resistor $R_2$. This voltage drop on the drift region can lead to the negative resistance. The negative resistance can be effectively controlled by varying resistor $R_1$ because it changes the critical current when the injection starts (I*), and because the slope of negative resistance depends on the ratio of $R_2/R_1$. Thus the $R_1$ reduction increases the negative resistance region and the $R_1$ increase reduces the negative resistance region.

$$\frac{R_2}{R_1} = \frac{N_{D1} A_1 W_2}{N_{D2} A_2 W_1},$$

where $A_2$ is the total area of the drain region and $A_1$ is smaller since current cannot flow through the P region. $W_1$ is close to the thickness of the P region and $W_2$ is the distance between the P region and substrate. The required breakdown voltage sets the donor concentration in the bottom epitaxial region ($N_{D2}$), but the donor concentration in the top region ($N_{D1}$) can be adjusted.

One of the ways to control negative resistance in Field Effect Rectifiers is to adjust the donor concentration in the top layer, which was analyzed in Rodov V., Ankoudinov A. L., Ghosh P., Solid State Electronics 2007; 51:714-718. There a reduction of $N_{D1}$ twice, by the use of a double layer epitaxial structure, was enough to remove negative resistance from the I-V curve. However, this solution of the negative resistance problem may be not the best practical approach, since it is more difficult to manufacture double layer epitaxial structures.

Another major concern is how fast the diode can be switched from forward current conduction to reverse current blocking. One of the major concerns in reverse recovery is the storage time which depends at least in part on how much charge is present in the barrier region. It takes some time to remove this charge, before the depletion layer can be developed to support reverse voltage. The total stored charge still largely determines the total reverse recovery, however some reasonable amount of storage charge is useful since it can provide soft recovery and reduce electro-magnetic interference problems. Thus the softness of reverse recovery is affected by the total stored charge and junction capacitance. To optimize diode reverse recovery it is helpful to be able to quickly deplete the channel region and to be able to trade off between speed of reverse recovery and electromagnetic emissions.

A brief overview of the prior art leads to following conclusions:

Field Effect Diodes provide a good combination of performance and reliability which cannot be achieved by conventional Schottky or PN-junction technologies.

To avoid negative resistance, prior art Field Effect Diodes typically need special means to adjust the top layer resistance.

The ability to rapidly deplete the channel region and operate at high frequency without large electromagnetic interference is desirable in at least some embodiments.

SUMMARY OF THE INVENTION

The present invention comprises an Adjustable Field Effect Rectifier (sometimes "AFER" hereinafter) device having an adjustment pocket or region which permits the device to function reliably and efficiently at high voltages without the negative resistance of prior art devices, while also permitting fast recovery and operation at high frequency without large electromagnetic interference. The process for fabricating a device according to the invention comprises opening the gate oxide followed by ion implantation to create a dopant concentration below that opening. The opening can be covered by oxide, if contact between the doped region and the metal is not desired.

The introduction of the adjustment pocket of the present invention gives a much more flexible device design because it allows modification of the top layer resistance during processing. In some embodiments, it is desirable to increase the top layer resistance, which can be accomplished by a P+ implantation into the pocket. Alternatively, an N+ implantation is used to decrease the top layer resistance. For high voltage devices, the P+ implant is useful to remove negative resistance and thus correct Field Effect rectifier performance. The N+ implant is useful to improve the performance of low voltage diodes. Additional advantages of the adjustment pocket structure are to allow the reduction of the junction capacitance and of the charge stored in the channel area, thus improving the reverse recovery characteristics of the diode.

The present invention can be better understood from the following Detailed Description of the Invention, taken in combination with the appended Figures, as described below.

THE FIGURES

FIG. 1 illustrates a prior art structure of the Field Effect barrier rectifier. Oxide on the top is a remnant of the self-alignment process and represents a problem for metal adhesion and thermal heat removal. Resistance R1 needs to be reduced to address negative resistance problem.

FIG. 2 illustrates an embodiment of the Adjustable Field Effect Rectifier (AFER) in accordance with the invention. Resistance R1 is reduced by the geometry and resolves the negative resistance problem. The embodiment also promotes better thermal and electrical contact.

FIG. 3 is a schematic representation of an embodiment of an AFER as a MOSFET with gate electrode shorted to the source. Polarity of the diode is the same as that of the MOSFET intrinsic body diode. Such shorted MOSFET will not always function as an efficient diode, and structural parameters (gate oxide thickness, channel length, etc.) need to be chosen carefully.

FIG. 4 illustrates the operation of the AFER. During forward bias the depletion layers from various P-regions do not overlap (shown by dashes) and electrons can easily flow from the channel region to the drain. During reverse bias depletion layers grow in size and after pinch-off start to overlap (see dash-dots). This pinch-off effect helps to reduce the leakage of the device.

FIG. 5 illustrates in graphical form forward current density versus applied voltage for an embodiment of a 600 V AFER. The structure without adjustment area exhibits negative resistance (leftmost curve at V axis). Introduction of the adjustment area 0.25 um (middle curve at V axis) or 0.35 um (rightmost curve at V axis) wide fixes the problem. The width and doping concentration in the adjustment area can be used also to improve device performance at low current density.

FIG. 6 shows an intermediate structure after vertical etching through the polysilicon gate and gate oxide (can leave some of gate oxide to reduce the channeling) using the Gate mask.

FIG. 7 illustrates a cover mask placed on the Gate mask to cover the adjustment area opening.

FIG. 8 illustrates the structure of an embodiment after a P+ well boron implant and contact arsenic implant are performed.

FIG. 9 illustrates a trench etched in silicon to provide ohmic contact to the P-well. Notice that only small portion of implanted As is left.

FIG. 10 illustrates an embodiment after both masks are isotropically etched. This self-aligning step provides uniform barrier height throughout the device.

Figure 11:
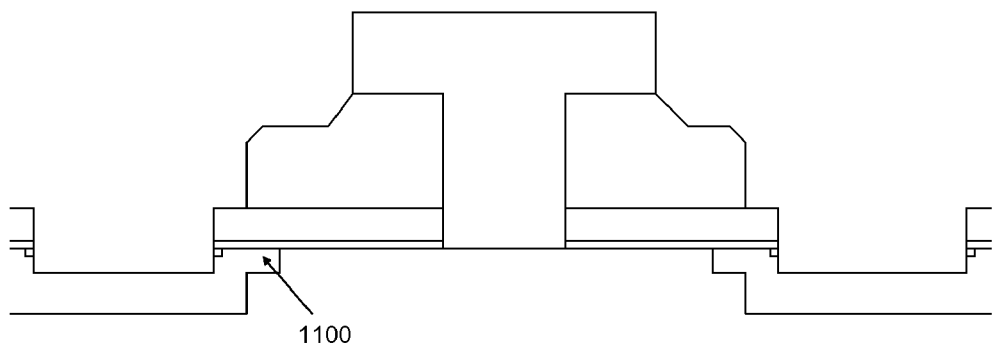

FIG. 11 illustrates an embodiment after channel boron is implanted. The Implantation dose determines the potential barrier height inside the channel. It is desirable to use a self-aligning process in at least some embodiments to help ensure having the same barrier height throughout the chip.

Figure 12:
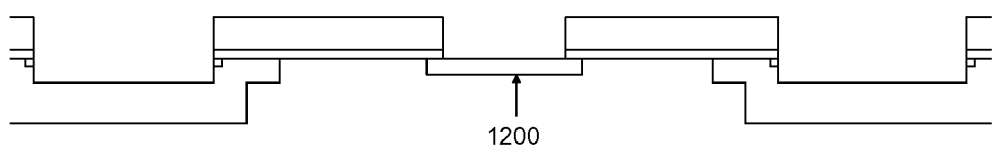

FIG. 12 shows an embodiment after the Gate and Cover masks are removed. Contact boron is implanted. If the dose is high, the barrier height in the adjustment area is higher than in the channel region. In this case it can be a final structure. Otherwise, oxide or oxide walls can be put in the adjustment area, as shown below.

Figure 13:
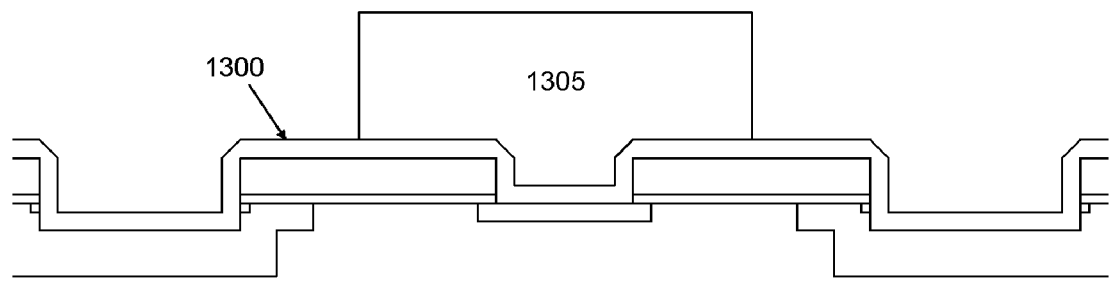

FIG. 13 shows an embodiment after the insulating oxide layer is deposited. The Cover mask is placed to keep oxide in the adjustment area.

Figure 14:
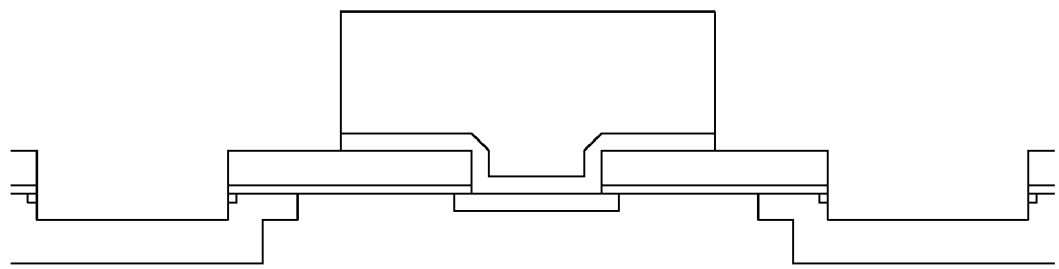

FIG. 14 shows an embodiment after the oxide is etched.

Figure 1:
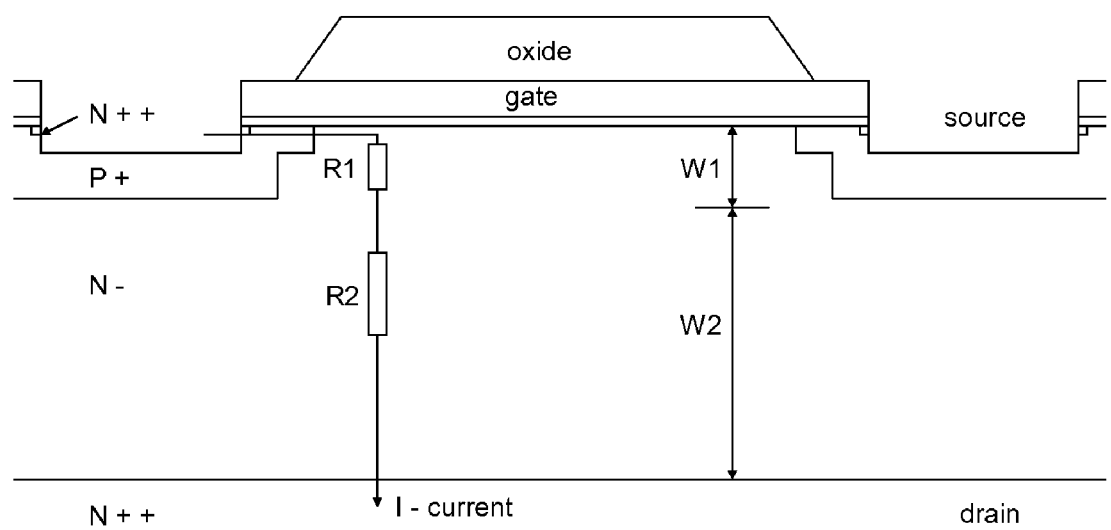
Figure 15:
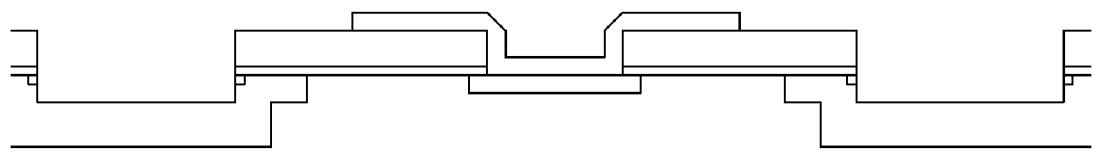

FIG. 15 shows an embodiment after the cover mask is removed. It can used as a final structure in some implementations, which prevents any current through the adjustment area. This is the structure if adjustment area implant type was the same as EPI type in order to reduce resistor (in this case contact implant can be done before Cover mask is placed for the first time—see FIG. 1).

Figure 16:
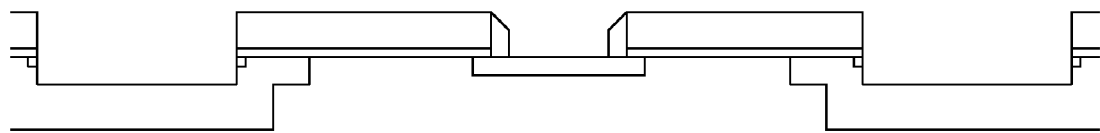

FIG. 16 shows an embodiment where the oxide is vertically etched to leave just the oxide sidewalls, and can be the final structure for some embodiments. This final structure is preferred when the contact implant is of the opposite type than the EPI type. Without an oxide side wall the potential barrier under the gate in the adjustment area can be too small in some implementations.

DETAILED DESCRIPTION OF THE INVENTION

Figure 2:
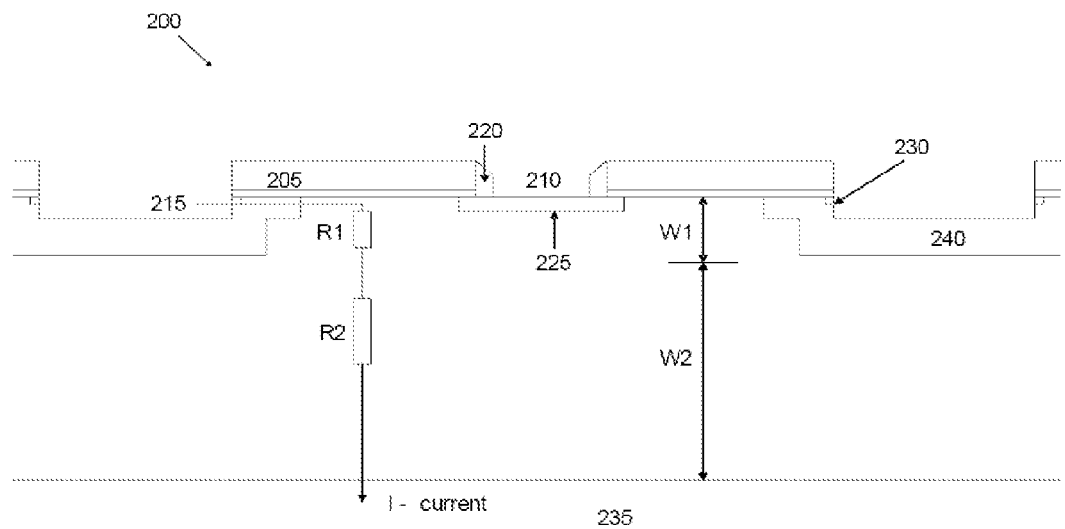

Referring first to FIG. 2, en embodiment of an Adjustable Field Effect Rectifier (sometimes abbreviated as "AFER"

hereinafter for simplicity) in accordance with the invention is shown generally at 200, and in the illustrated arrangement includes an adjustment area, or pocket, discussed in greater detail hereinafter. The barrier for the carrier transport is created under the MOS gate 205 due to the field effect. The barrier height is controlled by the gate material, the gate oxide thickness and the doping concentration in the semiconductor under the gate. A pocket 210 is etched in the middle of the gate, and a shallow P+ implant is created under that opening, which can be insulated from the source 215 via oxide layer 220 or directly connected to the source electrode (for faster performance). The described arrangement is depicted in FIG. 2. For clarity the connection between the source, gate and pocket area is omitted from FIG. 2, but is included in FIG. 4. The connection is typically implemented by a conductive layer, such as a metal layer, for example The shallow P+ implant 225 restricts the current flow of majority carriers, thus increasing the top layer resistance R1. Those skilled in the art will appreciate that the device of the present invention can be either N-type or P-type, depending upon the substrate and related processing. For purposes of clarity, an N-type substrate is described hereinafter, but is not to be considered limiting.

The adjustment pocket 210 comprises an opening 225 in the gate 205, into which a dopant is implanted. In some embodiments, the adjustment pocket can also comprise an oxide over the opening 220 to assist in ensuring that no significant current can pass through adjustment area. In at least some embodiments, it is desirable to have substantially identical resistors from both sides of the gate opening, to prevent one side from becoming less active during operation. Such an imbalance can cause deterioration in device performance. To facilitate creating substantially equal resistance on both sides of the gate, a self-aligning processing is used in an embodiment The small N+ contact 230 provide the ohmic contact to the metal for electrons flow. In some embodiments, the N+ contact can be avoided if the Schottky barrier height at the contact is smaller than the barrier height under the gate. In such an embodiment the rectifying behavior is determined by the channel barrier and not the Schottky barrier height. The N++ substrate 235 provides ohmic contact on the backside of the structure and provides as many electrons as holes generated by the P-well 240, thereby maintaining quasineutrality.

Figure 3:
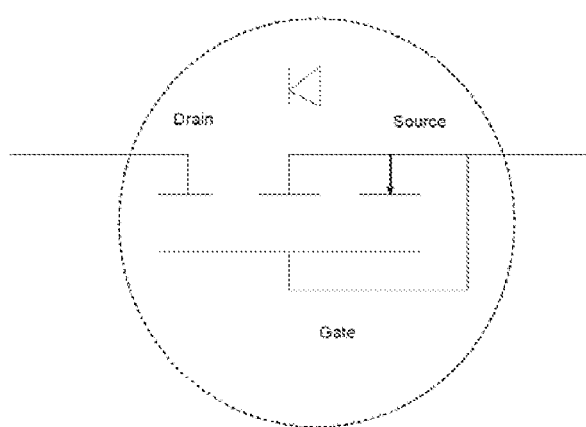

In a simplified view, the AFER structure of the present invention resembles the structure of a MOSFET, with the gate shorted to the source. Thus a MOSFET's electric circuit symbol can be modified to represent the AFER device, as shown in FIG. 3. However, in order to function as an efficient rectifier in accordance with the present invention, the structural parameters (gate oxide thickness, channel length, distance between channels, etc.) are significantly modified, including substantial removal of a layer of oxide that, in the prior art, would insulate the gate and source. In addition, the adjustment area is added, and is also shorted to the gate and the source. The result is that the structure of the present invention behaves as a high performance diode which does not exhibit negative resistance. The polarity of that resulting diode is the same as that of the intrinsic body diode. Thus for an N-type device the source electrode will become anode of the diode, and for a P-type device the source will be cathode of the diode.

Figure 4:
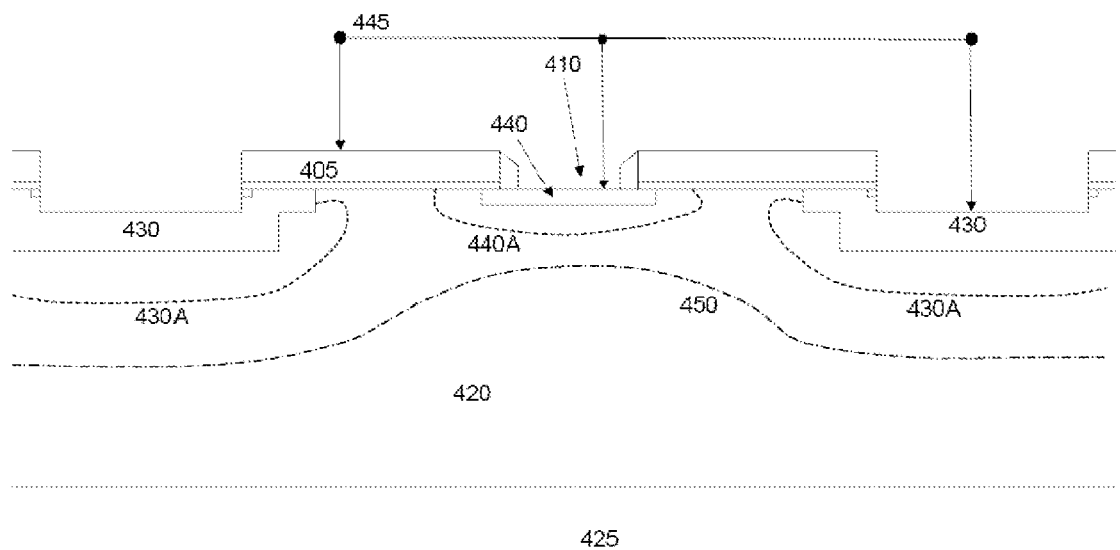

Referring next to FIG. 4, in forward bias, the current flows from the top source electrode 410 horizontally under the gate 405 to get over the channel barrier for carrier transport. Then the current spreads through the N-epitaxial layer 420, changes to a mostly vertical direction, and flows toward the drain electrode 425. The depletion layers of the P-well 430 and shallow P implant 440 (dashed lines 430A and 440A on FIG. 4) do not overlap, but restrict current flow to a narrow region and determine resistance R1. The vertical intrinsic PN diode 430 does not play any role until the combined voltage drop on the channel and resistance R1 reaches the "knee" voltage (about 0.6V). Above that voltage the P-well 430 injects holes into the N-epitaxial layer 420, which leads to conductivity modulation and provides the field effect rectifier of the present invention with the ability to handle large forward surge current.

During reverse bias, and because of the connection 445 shown between the source, gate and pocket area, the depletion layers 430A and 440A around the P-well 430 and P-pocket 440 grow in size and eventually start to overlap as shown at dotted dashed curve 450 on FIG. 4. It will be appreciated by those skilled in the art that the curve 450 can be thought of as an equipotential line that serves to describe the growth of the depletion layer during reverse bias. This determines a leakage current of the device. For the higher applied reverse bias the depletion layer behavior is similar to that of the PN junction diode. Note that P-pocket promotes the earlier pinch-off and lower leakage current of the device.

In at least several embodiments, the adjustment pocket provides several important improvements to device performance during the switching between forward and reverse bias. Since part of the gate is removed, junction capacitance is automatically reduced. This also means that fewer carriers will be accumulated under the gate when the device is forward biased. This further reduces the storage time that has to elapse before the depletion layer starts to develop during reverse recovery. Thus, in an embodiment, the traditional methods for controlling carrier lifetime (e.g. electron irradiation), together with the adjustment pocket, allows optimization for reverse recovery, which in turn permits operation at maximum frequency with minimum electromagnetic interference.

Figure 5:
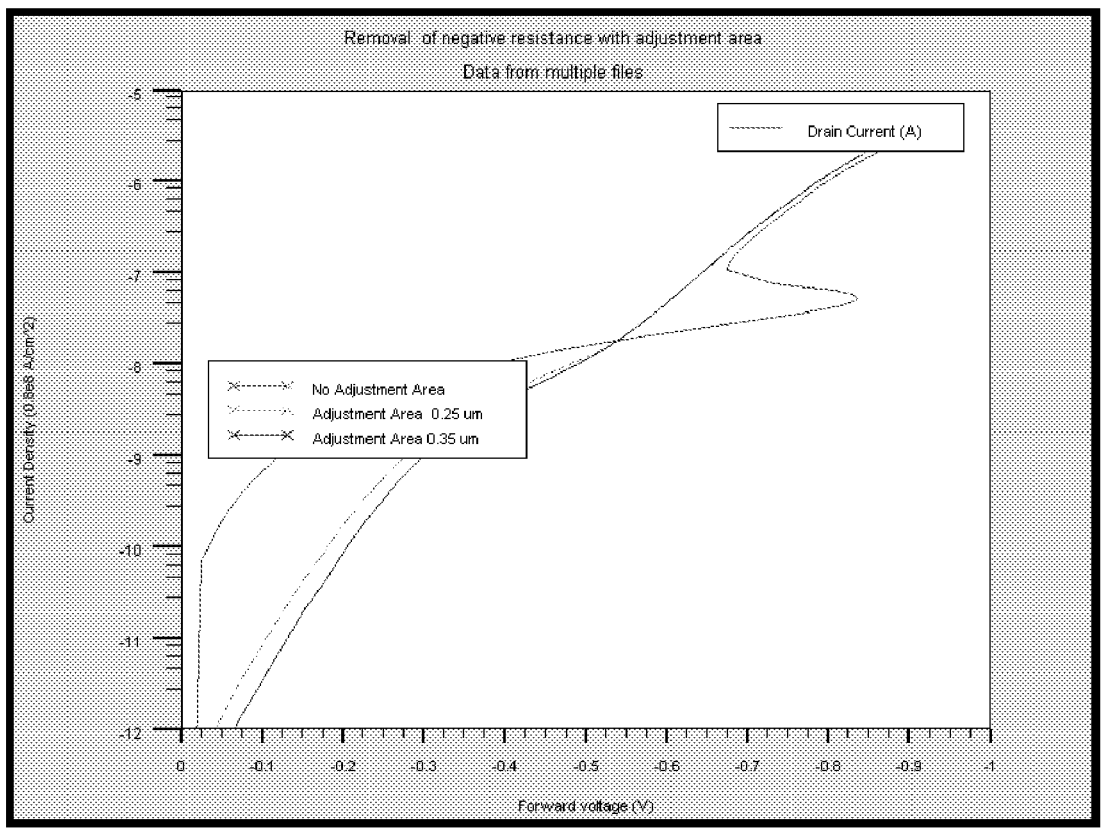

As illustrated in FIG. 5, in at least some embodiments the adjustment region also provides adjustment of the top resistor to avoid negative resistance in high voltage AFERs. The leftmost curve at the V axis shows the I-V characteristic of the diode without the adjustment area of the present invention, and exhibits negative resistance. The middle curve at the V axis shows the I-V curve for the same device parameters with an adjustment area of 0.25 μm added in accordance with the present invention, and shows no trace of the negative resistance. The rightmost curve at the V axis shows the I-V curve for a device with 0.35 μm, and also shows elimination of the negative resistance. This method of controlling negative resistance has the advantage that uniform dopant concentration can be used, which is simpler to manufacture.

Low voltage devices, with a breakdown voltage below 100 volts, typically do not have the negative resistance problem. To optimize these structures, it is desirable to minimize the forward voltage of the device while keeping leakage at acceptable level. In some embodiments, the adjustment region also helps such optimization by including an N+ pocket implant to reduce the resistance modeled as resistor R1 in FIG. 2. In these embodiments a thick oxide is preferably deposited in the adjustment pocket, to prevent the current flow through the pocket. This step is included within the process flow discussed below, although it is not required in all embodiments.

Those skilled in the art will appreciate that the AFER structure described above provides improvements in reverse recovery as well as controlling the value of the top resistance R1. As discussed above, an increased value of R1 is useful for high voltage devices to solve the negative resistance problem, while a reduced value of R1 can be used to improve efficiency of the low voltage devices.

Referring next to FIGS. 6-16, generally, one embodiment of a process for manufacturing AFER devices can be better appreciated. It is assumed that an epitaxial layer has been grown on a substrate, together with the following steps that are typical of production of semiconductor devices and so are not shown in detail. The breakdown voltage can be adjusted by varying the doping concentration (N-type) and the thickness of this epitaxial layer. A guard ring (GR) structure, on the order of 0.5 to 5 µm in at least some embodiments, is built using one of the standard methods, and a field oxide is formed by either thermal oxidation, CVD of silicon oxide, a combination of the two, or any other suitable method. The guard ring mask is used to open a window in the field oxide, through which a P-well implant is introduced, followed by thermal diffusion. The field mask is then used to open a window in the field oxide for fabrication of the active area of the device.

Figure 6:
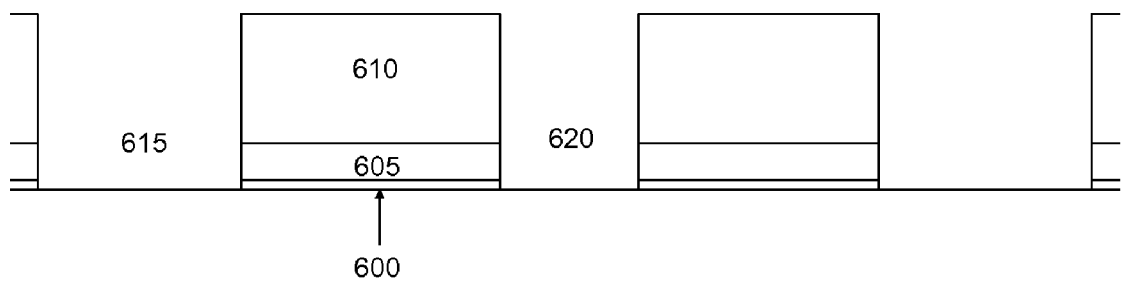
FIGS. 6-16 illustrate processing steps for fabricating an embodiment of the invention. In particular.

Referring particularly to FIG. 6, a gate oxide 600 is grown to on the order of 30-200 Å, following by growing a layer of polysilicon 605 on the order of 600-1200 Å. A gate mask 610 is then developed, after which the polysilicon 605 is vertically etched, resulting in the structure shown in FIG. 6 with openings 615 and 620. If a reduction of the resistance shown as R1 in FIG. 2 is desired for the particular embodiment, a contact arsenic (As) implantation can be done at this stage through the openings 615 and 620.

Figure 7:
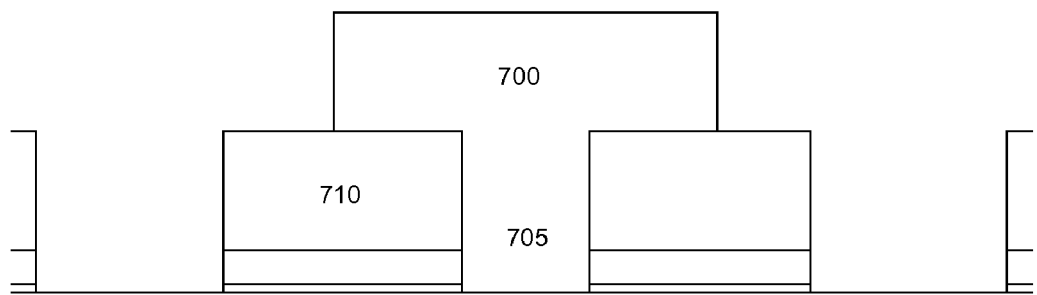

Referring next to FIG. 7, a second cover mask 700 is made on top of the gate mask 710 to cover the adjustment pocket 705. In some embodiments, it is desirable to adhesively affix the gate mask to the wafer, or, alternatively, to fabricate the gate mask from silicon nitride or other suitable material. This masking arrangement facilitates use of self-aligning process with uniform barrier heights and R1 values throughout the entire area of the device.

Figure 8:
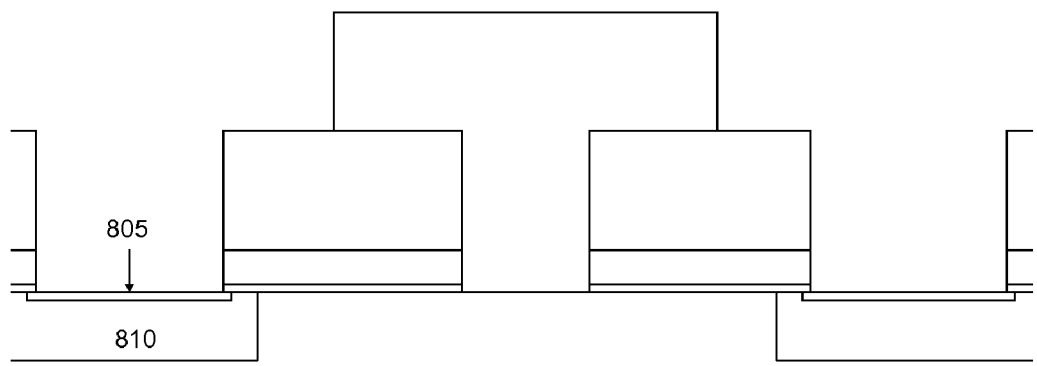

Referring next to FIG. 8, the contact arsenic implant 805 and P-well boron are implanted, resulting in P-wells 810. In some embodiments, the dose of P-well boron is selected to be high enough to restrict the main current flow through the channel area.

Figure 9:
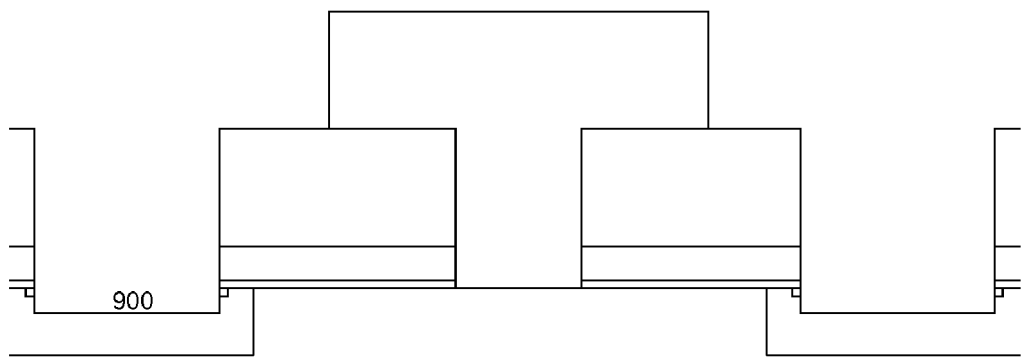

Referring next to FIG. 9, a contact well 900 is vertically etched into the silicon to provide contact to the P-well. In the absence of such a contact, the charge in the P-well can be affected by the hole current that flows to the anode through the P-wells of the guard ring structure. In some instances, this may slow down device operation. The contact wells help to optimize the use of the active device area and allow holes from P-well to flow directly to the source electrode. In addition, sufficient ohmic contact is preserved to allow for the flow of electrons, since most of the electron current is flowing through the narrow channel under the gate. It will be appreciated by those skilled in the art that, in some embodiments, only a small portion of the implanted As remains after formation of the contact wells.

Figure 10:
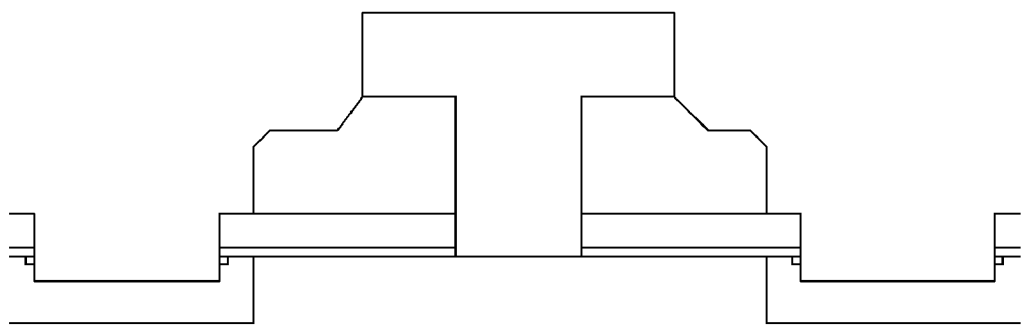

Referring next to FIG. 10, the gate mask 710 and the cover mask 700 are isotropically etched, which provides a self-aligned mask for a channel boron 1100 implantation shown in FIG. 11, thus helping to assure uniform barrier height throughout the relevant portion of the device. The cover mask is also etched at this stage, while still covering the adjustment area.

Referring to FIG. 12, the gate and cover masks are removed, followed by a P-type pocket 1200 implant to increase the resistance R1 of the top region, to restrict current flow. In some embodiments, and particularly those where the doping concentration under the gate in the adjustment pocket is larger than that in the channel region, the structure shown in FIG. 12 is the final structure. This can make further processing steps unnecessary.

However, in some embodiments, it is desirable to further develop the adjustment pocket by adding oxide sidewalls or a layer of oxide. This is shown beginning with FIG. 13, where a layer of oxide (identified by numeral 1300) on the order of 50-500 Å thick is deposited, followed by placement of a cover mask 1305. Then, referring to FIG. 14, the oxide is vertically etched, followed by removing the cover mask 1305, shown in FIG. 15. FIG. 15 depicts the final structure for those embodiments where the resistance shown as R1 in FIG. 2 is to be reduced, and an N-type implantation was made in the adjustment area. This approach permits reduction of R1 while also preventing electrons from flowing to the source through the opening of the adjustment area.

Next, as shown in FIG. 16, the oxide is vertically etched until only the oxide sidewalls are left. This structure depicts the final structure if the value of R1 is to be increased, together with the use of P-type implantation in the adjustment area. This structure permits holes from the P-contact in the adjustment area to flow to the source electrode, thus allowing for fast operation, while at the same time limiting electron flow to the source only through the channel region.

Having fully described an embodiment of the invention, together with numerous alternatives and equivalents, those skilled in the art will appreciate that numerous alternatives and equivalents exist which do not depart from the invention and are intended to be included within its scope. As a result, the invention is not to be limited by the foregoing description.

We claim:
1. An adjustable field effect rectifier comprising:
an epitaxial layer of N conductivity,
a pair of P wells, spaced apart from one another, formed in the epitaxial layer,
a gate area formed atop the epitaxial layer and comprising a gate of the adjustable field effect rectifier,
an opening through the gate area,
a P layer formed in the epitaxial layer through the opening, and
a conductive layer connecting at least a first P well of the pair of P wells, the gate of the gate area, and the P layer.
2. An adjustable field effect rectifier comprising
an epitaxial layer of a first conductivity and forming a drain on one side thereof,
a pair of wells of a second conductivity, opposite to the first conductivity, spaced apart from one another, formed in the epitaxial layer opposite the drain,
a gate area formed atop the epitaxial layer opposite the drain and comprising a gate of the adjustable field effect rectifier,
an opening through the gate area,
a layer of a second conductivity formed in the epitaxial layer through the opening, and
a conductive layer connected to the gate of the gate area, the layer formed through the opening, and one of the pair of wells.
3. The adjustable field effect rectifier of claim 1, further comprising:
a drain electrode;
a first terminal coupled to a first of the pair of P wells, the gate area, and the P layer; and
a second terminal coupled to the drain electrode,
wherein the adjustable field effect rectifier is arranged as a diode, the first terminal being an anode of the diode and the second terminal being a cathode of the diode.

4. The adjustable field effect rectifier of claim 1, further comprising:
an insulating layer to insulate the P layer from each of the pair of P wells.

5. The adjustable field effect rectifier of claim 1, further comprising:
an oxide layer formed in the opening between the P layer and the gate area.

6. The adjustable field effect rectifier of claim 1, wherein the gate area comprises a gate layer and a gate oxide, and
wherein the opening is formed through the gate layer and the gate oxide.

7. The adjustable field effect rectifier of claim 1, wherein the epitaxial layer includes a uniform dopant concentration.

8. The adjustable field effect rectifier of claim 1, wherein the P layer is arranged to restrict flow of majority carriers in a channel during operation of the adjustable field effect rectifier.

9. The adjustable field effect rectifier of claim 8, wherein the P layer is arranged to increase a resistance of the channel during operation of the adjustable field effect rectifier.

10. The adjustable field effect rectifier of claim 9, wherein, during operation of the adjustable field effect rectifier, the channel includes a first portion having a first resistance and a second portion having a second resistance, the second portion being farther from the gate than the first portion, and
wherein the P layer is arranged to increase a resistance of the first portion of the channel during operation of the adjustable field effect rectifier.

11. The adjustable field effect rectifier of claim 1, wherein the P layer and the pair of P wells are arranged such that, during operation of the adjustable field effect rectifier in a forward bias mode, a first depletion region associated with the P layer does not overlap with at least one second depletion region associated with the pair of P wells.

12. The adjustable field effect rectifier of claim 1, wherein the P layer and the pair of P wells are arranged such that, during operation of the adjustable field effect rectifier in a reverse bias mode, a first depletion region associated with the P layer overlaps with at least one second depletion region associated with the pair of P wells.

13. The adjustable field effect rectifier of claim 2, further comprising:
a first contact connected to the conductive layer;
a drain;
and a second contact connected to the drain,
wherein the adjustable field effect rectifier is arranged as a diode, the first contact being an anode of the diode and the second contact being a cathode of the diode.

14. The adjustable field effect rectifier of claim 2, wherein the layer of the second conductivity comprises a heavily-doped semiconductor layer.

15. The adjustable field effect rectifier of claim 2, wherein the gate area comprises a gate layer and a gate oxide, and
wherein the opening is formed through the gate layer and the gate oxide.

16. The adjustable field effect rectifier of claim 2, wherein the epitaxial layer includes a uniform dopant concentration.

17. The adjustable field effect rectifier of claim 2, wherein the layer of the second conductivity type is arranged to restrict flow of majority carriers in a channel during operation of the adjustable field effect rectifier.

18. The adjustable field effect rectifier of claim 17, wherein the layer of the second conductivity type is arranged to increase a resistance of the channel during operation of the adjustable field effect rectifier.

19. The adjustable field effect rectifier of claim 18, wherein, during operation of the adjustable field effect rectifier, the channel includes a first portion having a first resistance and a second portion having a second resistance, the second portion being farther from the gate than the first portion, and
wherein the layer of the second conductivity type is arranged to increase a resistance of the first portion of the channel during operation of the adjustable field effect rectifier.

20. The adjustable field effect rectifier of claim 2, wherein the layer of the second conductivity type and the pair of wells are arranged such that, during operation of the adjustable field effect rectifier in a forward bias mode, a first depletion region associated with the layer does not overlap with at least one second depletion region associated with the pair of wells.

21. The adjustable field effect rectifier of claim 2, wherein the layer of the second conductivity type and the pair of wells are arranged such that, during operation of the adjustable field effect rectifier in a reverse bias mode, a first depletion region associated with the layer overlaps with at least one second depletion region associated with the pair of wells.

22. A metal-oxide-semiconductor (MOS) device comprising:
a bulk region comprising a first semiconductor material;
a gate area, the gate area comprising a gate region and a gap in the gate region;
a pair of source regions;
a semiconductor region between the bulk region and the gap in the gate region, wherein the semiconductor region is formed between the pair of source regions; and
a conductive layer connecting at least one of the pair of source regions, the gate region of the gate area, and the semiconductor region.

23. The MOS device of claim 22, wherein the gate area further comprises a gate oxide between the bulk region and the gate region, the gate oxide comprising a second gap in the gate oxide aligned with the gap in the gate region.

24. The MOS device of claim 22, wherein the semiconductor region is formed between the bulk region and the gate region proximate to the gap in the gate region.

25. The MOS device of claim 22, wherein the first semiconductor material of the bulk region is of a first conductivity type and the semiconductor region comprises a second semiconductor material of the first conductivity type.

26. The MOS device of claim 25, wherein at least one of the pair of source regions comprises a third semiconductor material of a second conductivity type different from the first conductivity type.

27. The MOS device of claim 25, wherein the semiconductor region is arranged such that, during operation of the MOS device, the semiconductor layer decreases a resistance of the bulk region in a drift region of the bulk region.

28. The MOS device of claim 25, wherein, during operation of the MOS device, the bulk region includes a first portion having a first resistance and a second portion having a second resistance, the second portion being farther from the gate region than the first portion, and
wherein the semiconductor region is arranged to decrease a resistance of the first portion of the bulk region during operation of the MOS device.

29. The MOS device of claim 22, wherein the first semiconductor material of the bulk region is of a first conductivity type and the semiconductor region comprises a second semiconductor material of a second conductivity type different from the first conductivity type.

30. The MOS device of claim 29, wherein at least one of the pair of source regions comprises a third semiconductor material of the second conductivity type.

31. The MOS device of claim 29, wherein the semiconductor region is arranged such that, during operation of the MOS device, the semiconductor layer increases a resistance of the bulk region in a drift region of the bulk region.

32. The MOS device of claim 29, wherein, during operation of the MOS device, the bulk region includes a first portion having a first resistance and a second portion having a second resistance, the second portion being farther from the gate region than the first portion, and
   wherein the semiconductor region is arranged to increase a resistance of the first portion of the channel during operation of the MOS device.

33. The MOS device of claim 22, wherein the semiconductor region and the pair of source regions are arranged such that, during operation of the MOS device in a forward bias mode, a first depletion region associated with the semiconductor region does not overlap with at least one second depletion region associated with the pair of source regions.

34. The MOS device of claim 22, wherein the semiconductor region and the pair of source regions are arranged such that, during operation of the MOS device in a reverse bias mode, a first depletion region associated with the semiconductor region overlaps with at least one second depletion region associated with the pair of source regions.

35. The MOS device of claim 22, further comprising:
   a first terminal coupled to the conductive layer;
   a drain region;
   a second terminal coupled to the drain region.

36. The MOS device of claim 35, wherein the MOS device is arranged as a diode, the first terminal being an anode of the diode and the second terminal being a cathode of the diode.

37. The MOS device of claim 35, wherein the MOS device is arranged as a rectifying device.

38. The MOS device of claim 22, wherein the first semiconductor material of the bulk region includes a uniform dopant concentration.

39. The MOS device of claim 22, wherein the bulk region is an epitaxial region.

40. The MOS device of claim 39, wherein the epitaxial region is a lightly-doped epitaxial region.

41. The MOS device of claim 22, wherein a metal layer of the metal-oxide-semiconductor device is a non-metal layer.

42. The MOS device of claim 41, wherein the non-metal layer is a polysilicon layer.

43. The MOS device of claim 41, wherein the non-metal layer comprises the gate region of the gate area.

44. The MOS device of claim 28, wherein the first portion of the bulk region is a drift region.

45. The MOS device of claim 32, wherein the first portion of the bulk region is a drift region.

* * * * *

UNITED STATES PATENT AND TRADEMARK OFFICE
CERTIFICATE OF CORRECTION

PATENT NO. : 8,148,748 B2
APPLICATION NO. : 12/238308
DATED : April 3, 2012
INVENTOR(S) : Alexei Ankoudinov et al.

It is certified that error appears in the above-identified patent and that said Letters Patent is hereby corrected as shown below:

In the Specification:
Col. 5, line 64, should read:
from the top source electrode 445 horizontally under the gate Signed and Sealed this
Eighth Day of October, 2013

Teresa Stanek Rea
*Deputy Director of the United States Patent and Trademark Office*